(12) United States Patent
Chen et al.

(10) Patent No.: US 7,275,023 B2
(45) Date of Patent: **\*Sep. 25, 2007**

(54) SYSTEM AND METHOD OF INTERACTIVELY GENERATING A FAMILY OF MESH MODELS

(75) Inventors: Yifan Chen, Ann Arbor, MI (US); Paul J. Stewart, Ann Arbor, MI (US); Pietro Buttolo, Dearborn Heights, MI (US); Anne Marsan, Ann Arbor, MI (US)

(73) Assignee: Ford Motor Company, Dearborn, MI (US)

( * ) Notice: Subject to any disclaimer, the term of this patent is extended or adjusted under 35 U.S.C. 154(b) by 673 days.

This patent is subject to a terminal disclaimer.

(21) Appl. No.: 10/353,357

(22) Filed: Jan. 29, 2003

(65) Prior Publication Data

US 2004/0148145 A1    Jul. 29, 2004

(51) Int. Cl.
*G06F 17/10* (2006.01)

(52) U.S. Cl. .............................. 703/2; 703/7; 345/646; 345/427; 345/421; 700/187; 700/98; 700/255

(58) Field of Classification Search ................... 703/2, 703/11; 345/646, 427, 421, 420; 705/9; 600/407; 700/187, 98, 255; 382/128
See application file for complete search history.

(56) References Cited

U.S. PATENT DOCUMENTS 4,821,214 A    4/1989 Sederberg .................. 364/522

(Continued)

OTHER PUBLICATIONS

Chen, Y., Stewart, P., Marsan, A., Mo, H. and Tonshal, B. A Mesh Feature Paradigm For Rapid Generation of CAE-Based Design of Experiments Data, Proceedings of DETC'02, ASME 2002 Design Engineering Technical Conferences: Sep. 29-Oct. 2, 2002, Montreal, Canada.

(Continued)

*Primary Examiner*—Kandasamy Thangavelu
(74) *Attorney, Agent, or Firm*—Gifford, Krass, Sprinkle, Anderson & Citkowski, P.C.; Gary Smith

(57) ABSTRACT

A system and method for interactively generating a family of mesh models is provided for use in engineering analysis. The system includes a user computer system having a memory, a processor, a user input device and a display device. The system also includes a remotely located computer system having a processor, a memory, and a data storage means and in communication with the user computer system. The system further includes a computer-generated geometric mesh base model stored in the data storage means, a computer-generated mesh feature stored in the data storage means, and a new mesh model including the base mesh model with a mesh feature that is stored in the data storage means. The method includes the steps of selecting a base model from a model library maintained in the data storage means. The method also includes the steps of creating a mesh feature that is defined by a modifiable set of parameters and saving the mesh feature in a mesh feature library maintained in the data storage means. The method further includes the steps of establishing a feature matrix by the user containing instructions for selectively applying the mesh feature to the base mesh model and using the feature matrix to selectively apply the mesh feature to the base model to generate a new mesh model that is available for further analysis.

25 Claims, 12 Drawing Sheets

U.S. PATENT DOCUMENTS

| | | | | |
|---|---|---|---|---|
| 5,119,309 | A | | 6/1992 | Cavendish et al. .... 364/474.24 |
| 5,179,644 | A | | 1/1993 | Chiyokura et al. ......... 394/141 |
| 5,253,331 | A | | 10/1993 | Lorenzen et al. ............. 395/50 |
| 5,504,845 | A | | 4/1996 | Vecchione .................. 395/119 |
| 5,903,458 | A | * | 5/1999 | Stewart et al. ................ 700/98 |
| 6,701,174 | B1 | * | 3/2004 | Krause et al. ............... 600/407 |
| 2002/0077797 | A1 | * | 6/2002 | Hall ............................ 703/11 |
| 2002/0183986 | A1 | * | 12/2002 | Stewart et al. .................. 703/2 |
| 2003/0058259 | A1 | * | 3/2003 | Kawaguchi et al. ........ 345/646 |
| 2003/0080957 | A1 | * | 5/2003 | Stewart et al. .............. 345/420 |
| 2003/0101085 | A1 | * | 5/2003 | Butler et al. .................... 705/9 |
| 2003/0103048 | A1 | * | 6/2003 | Kindratenko et al. ....... 345/421 |
| 2003/0191554 | A1 | * | 10/2003 | Russell et al. .............. 700/187 |
| 2003/0200066 | A1 | * | 10/2003 | Stewart et al. .................. 703/2 |
| 2003/0222871 | A1 | * | 12/2003 | Brombolich ................ 345/427 |
| 2004/0010346 | A1 | * | 1/2004 | Stewart et al. .............. 700/255 |
| 2005/0018885 | A1 | * | 1/2005 | Chen et al. ................. 382/128 |

OTHER PUBLICATIONS

Yifan Chen, Paul Stewart and Pietro Buttolo, "A Real-Time, Interactive Method for Fast Modification Of Large-Scale CAE Mesh Models," ASME 2000 Design Engineering Technical Conferences and Computers and Information in Engineering Conference, Sep. 10-13, 2000.

Bloor, M.I.G. and M.J. Wilson, 1989, "Blend design as a boundary-value problem," Theory and Practice of Geometric Modeling, W. Staber and H.P. Seidel, eds., Springer-Verlag, Berlin.

Celniker, G. and D. Gossard, 1989, "Energy-based Models for Free-Form Surface Shape Design," Proceedings of the ASME 1989 Design Automation Conference, Sep. 17-21, Montreal, QC, Canada.

Celniker, G. and D. Gossard, 1991, "Deformable Curve and Surface Finite-Elements for Free-Form Shape Design," Computer Graphics, 25(4):257-266.

Sederberg, T.W. and S.R. Parry, 1986, "Free-Form Deformation of Solid Geometric Models," Proceedings of the ACM SIGGRAPH, Computer Graphics, 20(4):151-160.

Stewart, P.J., 1991, Direct Shape Control of Free-Form Curves and Surfaces with Generalized Basis Functions, Ph.D. dissertation, The University of Michigan, Ann Arbor.

Stewart, P.J. and Y. Chen, 1999, "Geometric Features Applied to Composite Surfaces Using Spherical Reparametarization," Proceedings of the ASME 1999 Design Engineering Technical Conferences, Sep. 12-15, Las Vegas, NV.

Terzopoulos, D. and H. Qin, 1994, "Dynamic NURBS with Geometric Constraints for Interactive Scuipting," ACM Transactions on Graphics, 13(2):103-136.

Beckmann, D., 1994, "Space Deformation: An Interactive Animation Technique," Computer Graphics 18(4):571-586.

Coquillart, S., 1990, "Extended Free-Form Deformation: An Interactive Animation Technique," Computer Graphics 24(4): 187-193, 1990.

Chen, Y., Stewart, P., Marsan, A., Mo, H., and Tonshal, B., "Cataloging Mesh Features for CAE-Based Design Experiments" Technical Report, SRR-2001-0232, 2001.

Lamousin, H.J. and Waggenspack, W.N. 1994, "NURBS-Based Free-Form Deformation," IEEE CG&A, 14(6):59-65.

Chen, Y., Marsan, A., Stewart, P., Tonshal, B., and Mo, H., "Developing Advanced Mesh Manipulation Capabilities for IMF2.3", Technical Report, SRR-2001-0201, 2001.

Chen, Y. Stewart, P. Buttolo, P. Marsan, A, And Tonshal, B. "Using an IMF Lattice Deformation Tool to Modify CAE Mesh Models," Technical Report, SRR-2000-197-2000.

Marsan, A., Chen, Y., and Stewart, P.J. 2001, "An Finite Element Approach to Direct Surface Manipulation," in Proceedings of ASME DETC'01, DETC'01/DAC 21103.

Stewart, P and Chen Y, "IMF 1.0 User Manual," Technical Report, SRR-1999-013 8, 1999.

* cited by examiner

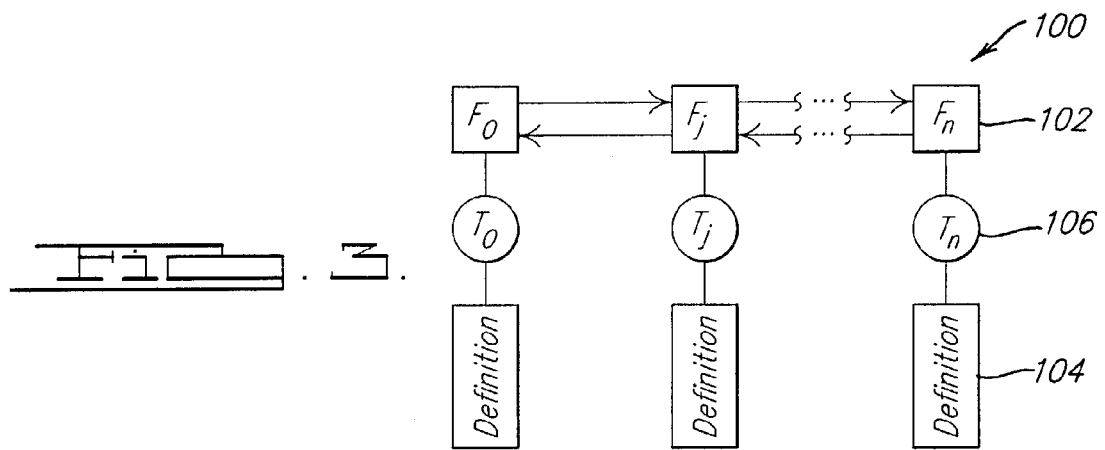
FIG. 3.
| Run | Hood Angle | WS Angle | Glass Offset | Spoiler |
|---|---|---|---|---|
| 0 | − | − | No | No |
| 1 | + | − | No | Yes |
| 2 | − | + | No | Yes |
| 3 | + | + | No | No |
| 4 | − | − | Yes | Yes |
| 5 | + | − | Yes | No |
| 6 | − | + | Yes | No |
| 8 | + | + | Yes | Yes |
FIG. 4.
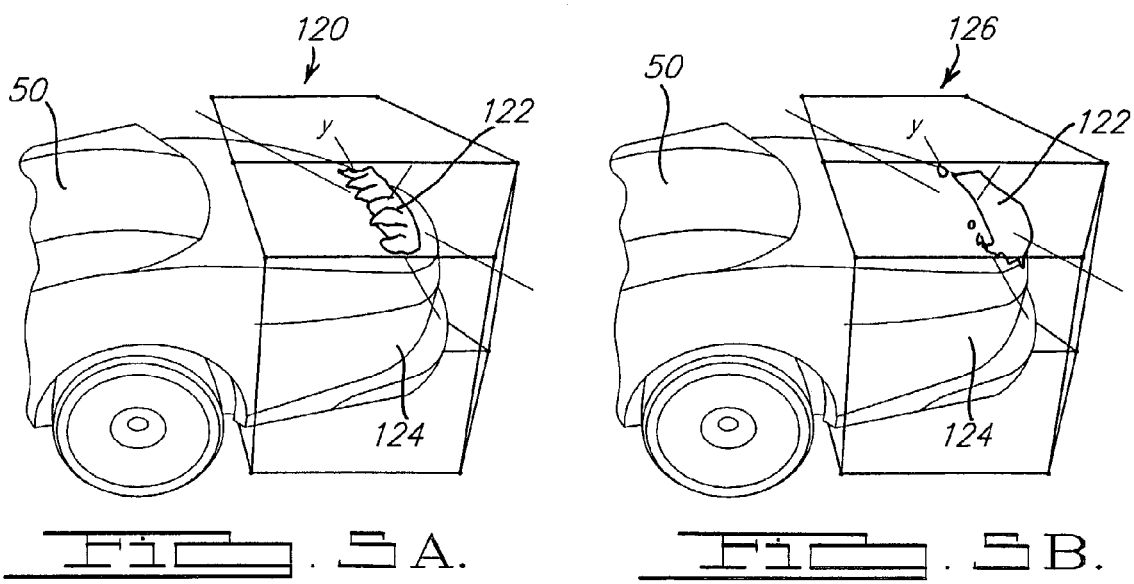
FIG. 5A.   FIG. 5B.

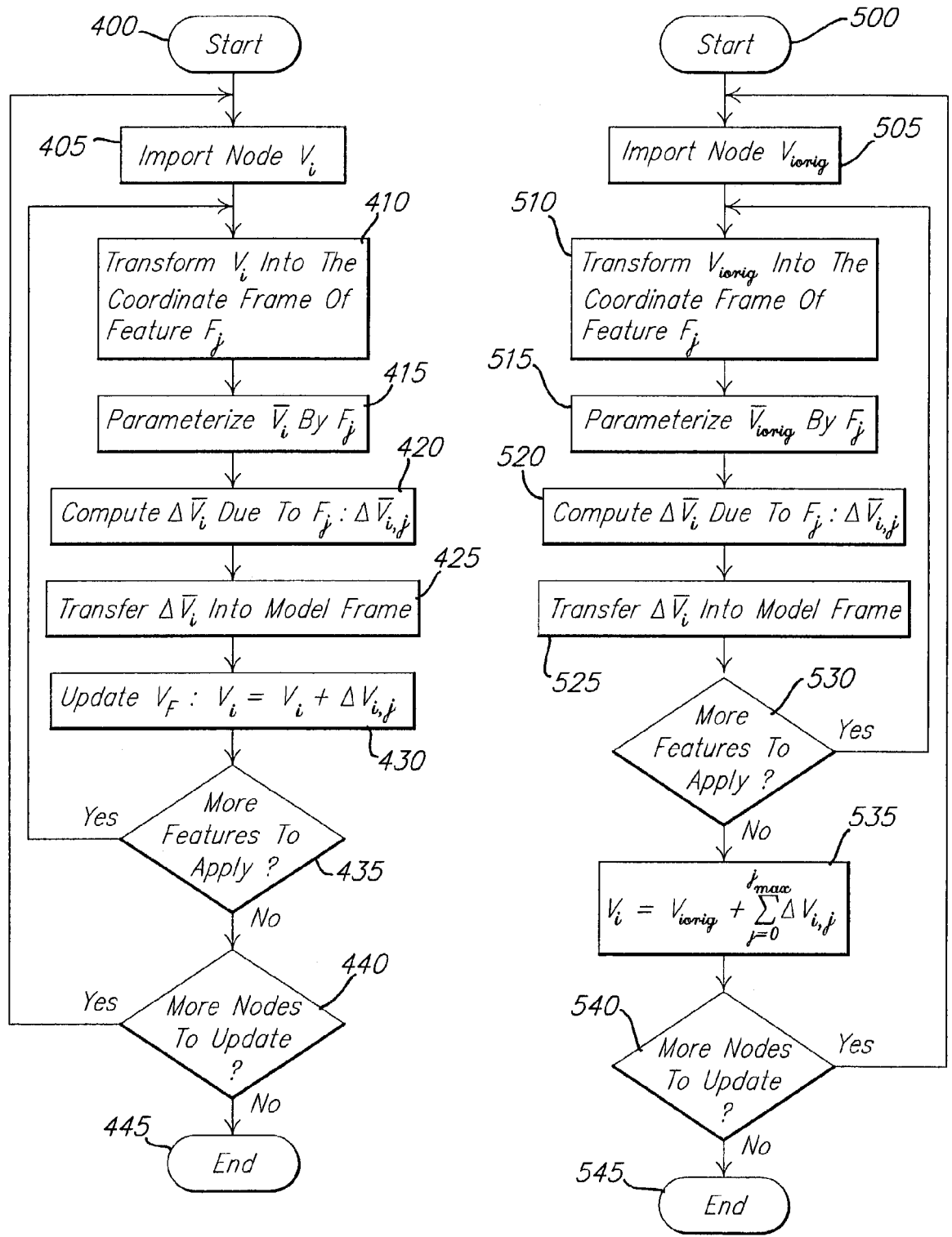

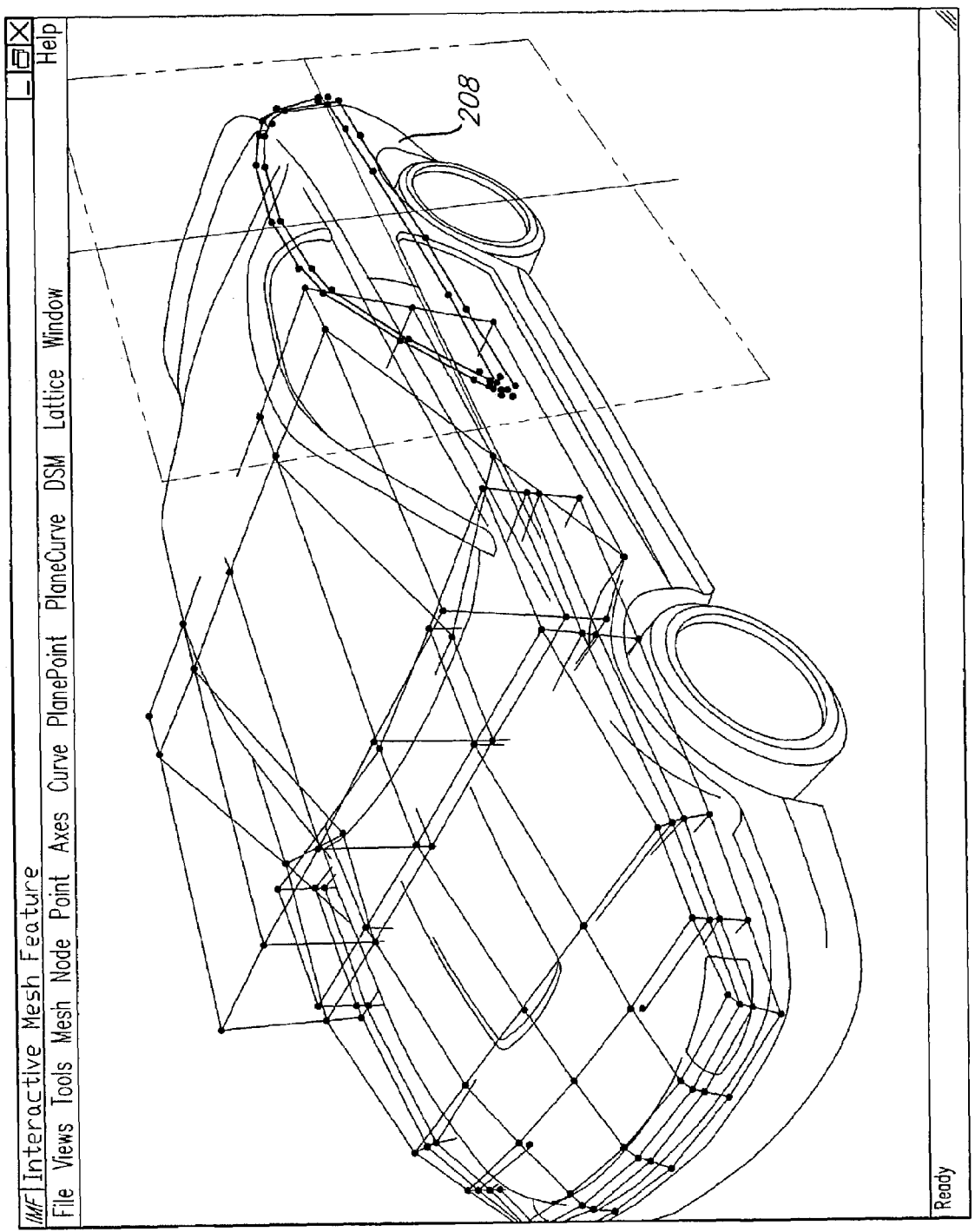

SYSTEM AND METHOD OF INTERACTIVELY GENERATING A FAMILY OF MESH MODELS

BACKGROUND OF THE INVENTION

1. Field of the Invention

The present invention relates generally to computer-assisted design of models and, more specifically, to a system and method of automatically generating a family of mesh models for use in Computer-Aided Engineering (CAE) analysis.

2. Description of the Related Art

The design process of a product, such as an automobile, has advanced to a state in which computer-assisted design techniques are frequently incorporated in the development of the product, or redesign of an existing product. At the same time, enhanced visualization software tools have been developed that allow for interactive display and manipulation of large-scale geometric models of the product, including models developed using Computer-Aided Design (CAD).

Computer-assisted design techniques are typically utilized in the design of a vehicle model. The combined use of CAD and visualization techniques are especially beneficial in designing, packaging and assembling the various systems incorporated within the vehicle, to maximize the design and functional capabilities of these vehicles. Advantageously, potential vehicle system designs can be considered in a timely and cost-effective manner by analyzing a digital representation of a proposed design, versus preparing a physical prototype of the vehicle.

One aspect of the design process is to construct a geometric model of the proposed design using a technique known as Computer-Aided Design (CAD). Another aspect of the design process is the use of mathematical tools, collectively referred to as Computer-Aided Engineering (CAE), to constrain and guide the designer in evaluating the design and to optimize the performance of the product. The use of a CAE simulation allows for verification of a design intent, and a prediction of a mechanical behavior of the design, including its systems, subsystems and components, and suggestions for improvements. CAE simulations are advantageous in particular types of vehicle analysis, such as vehicle aerodynamics analysis, safety analysis and structural analysis. Examples of CAE techniques include Finite Element Analysis (FEA) and Computational Fluid Dynamics (CFD). Recent enhancements to the computing and software power of modern computers have resulted in a significant reduction in the amount of computer (CPU) time required to perform an analysis, such as an FEA run. Therefore, CAE tools can be utilized much earlier in the product development process and applied to a wider range of product development activities.

An emerging trend in the product development process as a result of enhanced CAE computational capabilities is Design of Experiments (DOE) utilizing CAE results rather than results collected from testing physical prototypes. DOE is an engineering design practice that enables a designer to conduct a series of tests corresponding to variations in a set of predetermined design parameters. One benefit of a CAE-based DOE is that a test that, in the past would require a physical experiment on a physical prototype, can now be performed using a CAE simulation and a geometric (digital) model. As a result, the DOE can be conducted in an early phase of the product development process, and proposed modifications to the design can be expeditiously analyzed.

For example, an airflow DOE provides aerodynamic information regarding the exterior shape of the vehicle for use in the design of the exterior shape of a vehicle. CFD is utilized to calculate aerodynamic properties, ranging from drag and lift coefficients to wind-noise characteristics, in response to a set of vehicle exterior shape parameters. Since the CFD simulation uses a geometric model of the vehicle, the airflow DOE can be performed early in the design process, before a physical prototype is built.

Currently, the CAD model of a product is converted into a mesh model suitable for CAE analysis, such as a finite element mesh model. The Computer-Aided Engineering (CAE) simulation is performed by the user using a predetermined set of parameters, and the results of the simulation are available for additional study and evaluation. If the user wants to change a design parameter based on the generated response, the CAD model is modified in light of the changed design parameter, and the updated CAD model is converted into a model format suitable for CAE analysis.

A significant disadvantage of the prior art is that the step of modifying a CAD model is costly and time-consuming to implement, since it must be performed each time a change is made to the set of DOE parameters. A CAD system requires a significant amount of overhead, including user-time, training and experience. The cost and time associated with having to use a CAD system to update the mesh model detracts from the advantages associated with using a CAE simulation, such as in a DOE analysis.

A system and methodology of performing a CAE simulation using direct mesh manipulation of a mesh model is illustrated is also described in commonly assigned U.S. patent Ser. No. 09/681,732, which is hereby incorporated by reference. Advantageously, the use of direct mesh modeling expands and integrates a mathematical surface modeling technique referred to in the art as Direct Surface Manipulation, or DSM. With DSM, an entire surface feature is placed on an existing parametric surface as a single geometric entity. After the feature is created, a user can control its location, shape and continuity independently by adjusting corresponding parameters.

This system and methodology works well in directly modifying a feature of a mesh model using a technique such as Direct Surface Manipulation or Free-Form Deformation. However, it is desirable that additional productivity be gained with the ability to save a deformation applied to a model and apply it later or even to a different model without the need to recreating it from scratch. This notion of feature library or catalogue is, however, not included in the prior art.

Thus, there is a need in the art for a system and method for a user to interactively utilize a mesh feature catalogue to automatically and properly apply features to a base model and then generate a family of output meshes for further analysis such as for a Design of Experiment study.

SUMMARY OF THE INVENTION

Accordingly, the present invention is a system and method for interactively generating a family of mesh models for use in engineering analysis. The system includes a user computer system having a memory, a processor, a user input device and a display device. The system also includes a remotely located computer system having a processor, a memory, and a data storage means and in communication with the user computer system. The system further includes a computer-generated geometric mesh base model stored in the data storage means, a computer-generated mesh feature stored in the data storage means, and a new mesh model including the base mesh model with a mesh feature that is stored in the data storage means.

The method includes the steps of selecting a base model from a model library maintained in the data storage means. The method also includes the steps of creating a mesh feature that is defined by a modifiable set of parameters and saving the mesh feature in a mesh feature library maintained in the data storage means. The method further includes the steps of establishing a feature matrix (table) by the user containing instructions for applying a mesh feature selected from the mesh feature library to the base mesh model and using the feature matrix to apply the selected mesh feature to the base model to generate a new mesh model that is available for further analysis.

One advantage of the present invention is that a system and method of interactively generating a family of mesh models is provided that provides the user with the capability of cataloging a mesh feature for efficient, repeated evaluation of the feature as applied to a base model. Another advantage of the present invention is that a system and method of interactively generating a family of mesh models that provides the user with the capability of building a sequence of feature combinations to be applied to the base model, and generating a family of mesh models with the various feature combinations. Still another advantage of the present invention is that a system and method of interactively generating a family of mesh models is provided for cataloging the features in a context-free format that is independent of the mesh model to which it may be applied to. A further advantage of the present invention is that a system and method of interactively generating a family of mesh models is provided that allows for verification of design intent and prediction of mechanical behavior of the family of models in an expeditious manner. Yet a further advantage of the present invention is that a system and method of interactively generating a family of mesh models is provided for preprocessing mesh models for use in CAE analysis by creating a family of models corresponding to experimental runs for the CAE analysis.

Other features and advantages of the present invention will be readily appreciated, as the same becomes better understood after reading the subsequent description taken in conjunction with the accompanying drawings.

BRIEF DESCRIPTION OF THE DRAWINGS

FIG. 3 is a diagrammatic view illustrating how the mesh feature list is stored in a feature library, according to the present invention.

FIG. 4 is an example of a feature matrix, according to the present invention.

FIGS. 5a-5b are diagrammatic views illustrating the effect of feature replay order on the mesh model, using the method of FIG. 2.

FIG. 6 is a flowchart of a method of order-dependent feature replay, according to the present invention.

FIG. 7 is a flowchart of a method of order-independent feature replay, according to the present invention.

FIG. 13 is a diagrammatic view illustrating the effect of deforming the hood angle feature, deforming the windshield angle feature and adding a spoiler feature to a base model, using the method of FIG. 2.

DESCRIPTION OF THE PREFERRED EMBODIMENT(S)

A design of a model of a system is preferably achieved with a generic, parametric driven design process. Advantageously, the parametric process allows for flexibility in design and engineering analysis of the model in a fraction of the time required using conventional design methods. Various computer-based tools are integrated to achieve this enormous time and expense savings, including solid modeling, parametric design, and automated studies. In this example, the process is applied to a vehicle system, although other types of systems foreseeable.

A computer-generated geometric model representing a design form for a vehicle is partially shown at 50. The vehicle design is typically generated through the use of conventional Computer-Aided Design (CAD), including Computer-Aided Manufacturing (CAM) and Computer-Aided Engineering (CAE) techniques.

Figure 1:
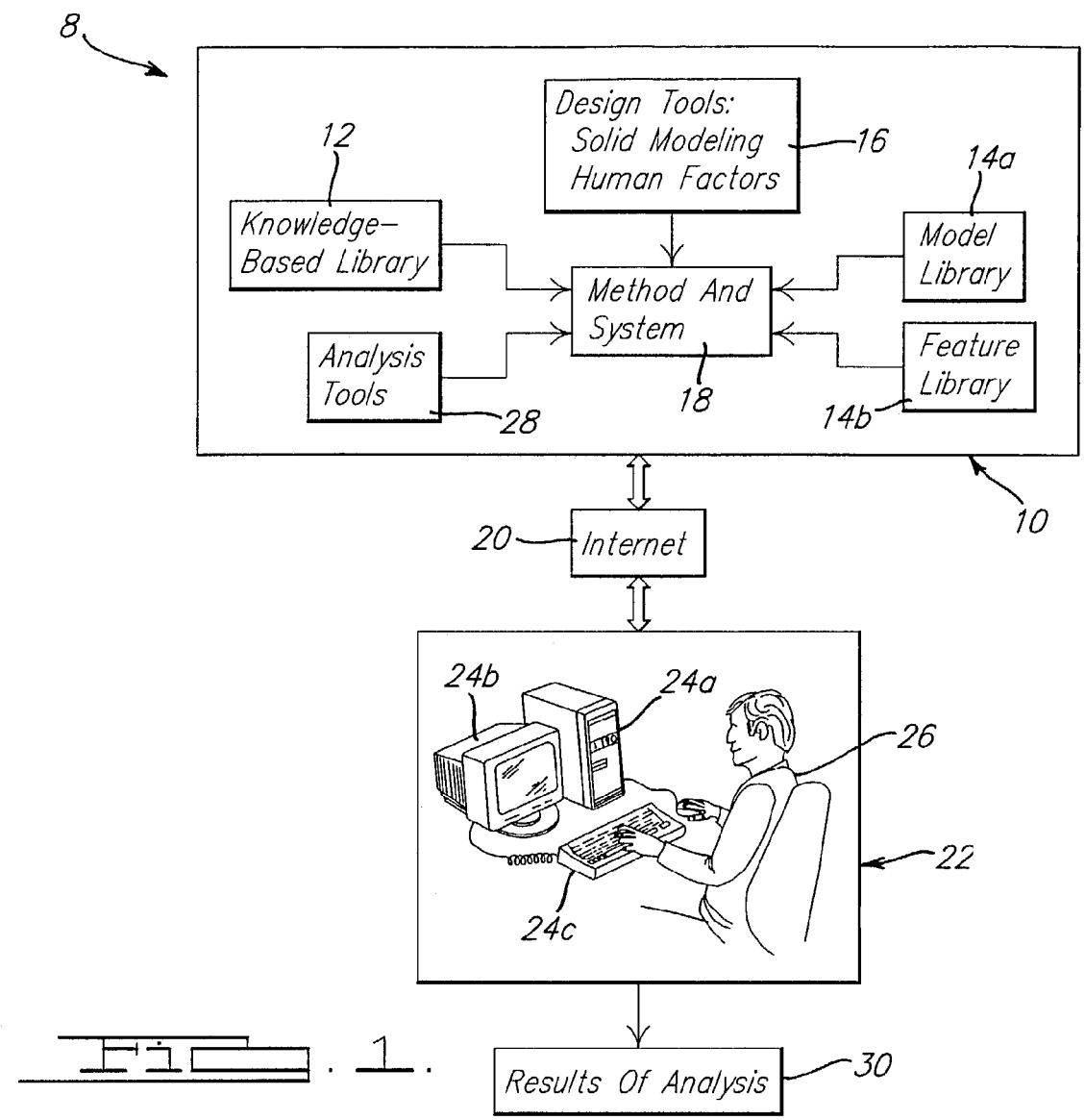
FIG. 1 is a diagrammatic view of a system for use in conjunction with a method of interactively generating a family of mesh models, according to the present invention.

Referring to the drawings and in particular to FIG. 1, a system 8 for interactively generating a family of mesh models is provided. The system 8 includes a remotely located computer system 10. The remotely located computer system 10 includes a server 18 having a processor, and a memory. The remotely located computer system 10 is in communication with a user computer system 22, to be described, using a communications network 20. The communications network 20 may include the Internet, an intranet or the like used to transfer information.

The computer system 10 includes a knowledge-based engineering library 12, preferably stored on an electronic storage device in communication with the server 18. The knowledge-based engineering library 12 may include a database of sub-libraries containing an electronic representation of data including various experts' knowledge of information relevant to the design of a product, such as the vehicle 50. The knowledge-based engineering library 12 may include information such as design, assembly and manufacturing rules and guidelines. The knowledge-based engineering library 12 may also contain data in electronic form regarding various types of vehicle subsystems. The knowledge-based engineering library 12 may further contain predetermined product assumptions regarding the vehicle 50 to be designed, such as model year, style, or production volume. The knowledge-based engineering library 12 may include a sub-library, such as a component parts library of particular component parts used on a vehicle.

The computer system 10 also includes a model library 14a, preferably stored on a remotely located electronic storage device. In this example, the model library 14a contains models, or an electrical representation of a vehicle model or a portion thereof. Advantageously, the model library 14*a* may contain a geometric model of an exterior portion of a particular vehicle.

The computer system 10 also includes a feature library 14*b*, preferably stored on a remotely located electronic storage. The feature library 14*b* contains information regarding a particular mesh feature. It should be appreciated that the feature library 14*b* may be a sub-library of the vehicle library 14*a*. Similarly, the feature library 14*b* and vehicle library 14*a* may be a sub-library of the knowledge-based engineering library 12.

The computer system 10 may also include various Computer-Aided Design (CAD) tools 16, which can be used by the method, to be described. These design tools 16 may include solid modeling, surface modeling, visualization and parametric design techniques. Solid modeling, for example, takes electronically stored vehicle model data from the model library 14*a* and standard component parts data from the knowledge-based engineering library 12 and builds complex geometry for part-to-part or full assembly analysis. Several modeling programs are commercially available and generally known to those skilled in the art.

The parametric design technique is used in the electronic construction of geometry within the user computer system 22, for designing the vehicle 50 or a portion thereof. As a particular dimension or parameter is modified, the computer system 22 is instructed to regenerate a new geometry.

The computer system 10 also includes various Computer-Aided Engineering (CAE) analysis tools 28. One example of a CAE analysis tool 28 is Computational Fluid Dynamics (CFD). Another example of a CAE analysis tool 28 is Finite Element Analysis (FEA). Several software programs are commercially available to perform these analyses and are generally known to those skilled in the art.

The system 8 includes a user computer system 22, having a processor, a controller, and a memory shown at 24*a* to process information relevant to the method stored in the processor 18 for interactively generating a family of mesh models. The computer system 22 includes a display device 24*b*, such as a video terminal, to display new model.

In this example, information is displayed on the display device 24*b* in a series of screens, also referred to as a browser. A user 26 inputs information into the computer system 22 when prompted to do so. The information may represent different parameter alternatives. The set of parameters or the set of instructions may be specific to the method of interactively generate a family of mesh models, wherein other data and information non-specific to the method may already be stored in the memory of the computer system 22. Selection and control of the information within a screen can be achieved by the user 26, via a user interactive device 24*c*, such as a keyboard or a mouse.

An example of an input method is a drawing technique used to draw a box around a local region of the model using the user interactive device 22*c*, such as the mouse. It should be appreciated that the drawing process includes a click, drag and release of the mouse, as is understood in the art. Another type of input method is a graphical user interface that allows menu selection, parameter modification and performs other types of viewing operations. Still another example of an input method is a pop-up dialog box containing available information or instructions. Preferably, the computer system 22 is configured to provide for fast display capability for rendering and viewing of large complex mesh models.

The computer system 22 utilizes the set of information or instructions from the user 26, information from the libraries 12, 14, design tools 16 and analysis tools 28 and any other information in carrying out a method, according to the present invention and discussed in detail subsequently, of interactively determining a family of mesh models using a base model and mesh features.

Advantageously, this is a time and cost savings as compared to performing the same evaluation using a physical prototype. In addition, the computer-implemented method of interactively determining a family of mesh models combines all of the foregoing to provide an efficient, flexible, rapid tool for evaluating the various design proposals. Furthermore, the information is catalogued, and arranged as a family of design proposals as shown at 30, for further analysis and study.

Figure 2:
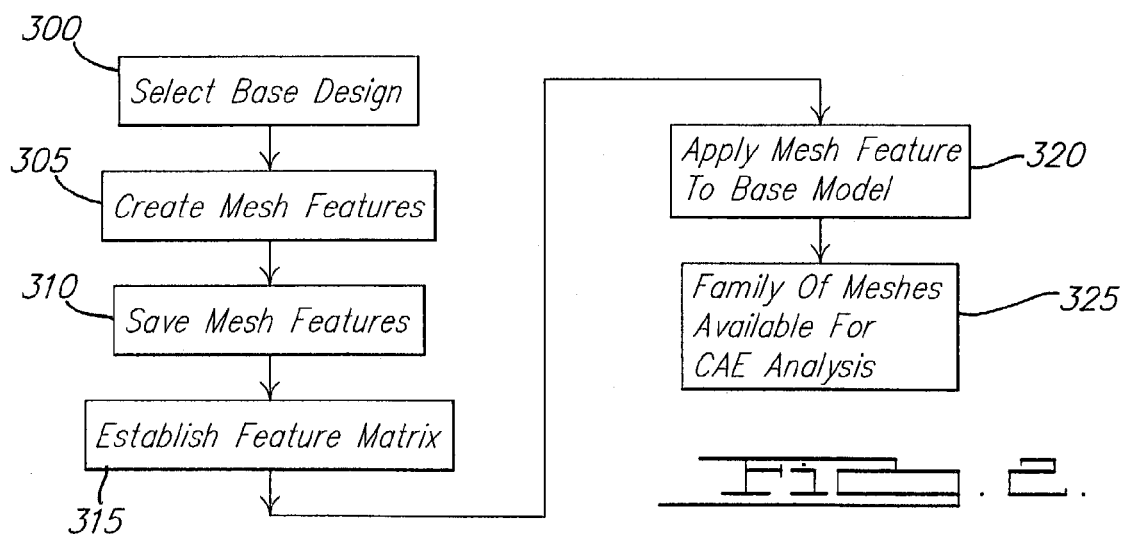
FIG. 2 is a flowchart of a method of interactively generating a family of mesh models using the system of FIG. 1, according to the present invention.

Referring to FIG. 2, a method of interactively determining a family of mesh models using a base model and mesh features is illustrated. The methodology advantageously isolates a region of the model for modification, maintains a smooth transition between the region and the rest of the model, and simultaneously modifies all nodes within the affected region in a controlled manner. A new model is created which includes the base model and the added features, while the base model is not modified. The methodology takes advantage of similarities between models by treating a set of mathematical operations associated with each mesh deformation as an independent entity that can be stored separately and reapplied to another model at another time.

The methodology begins in block 300 with the user selecting a base mesh model, and the base mesh model is imported into a computer program for interactively creating a geometric model. The computer program may be resident on the remotely located computer system 10 and accessible by the user computer system 22, or resident on the user computer system 22. The base model 50 is preferably stored in a database, such as the previously described model library 14*a* for quicker direct mesh modeling, feature creation, and manipulation. In this example, the base model 50 is the design of a vehicle. Preferably, the base mesh model 50 is a geometric model for performing a CAE simulation to assess the geometric properties of the model, and the model is imported into the methodology. An example of a geometric model is a mesh model, whereby each point representing the model is uniquely identified by a set of coordinates within a known coordinate system. Known mesh formats include STL and NASTRAN.

For example, a topological structure of the mesh model can be created by organizing a list of polygons into a connected surface mesh. The mesh is a collection of polygons describing a surface of the boundary shape of a solid object. Preferably, the surface is divided into a large number of polygons, to represent surface details with a certain degree of accuracy. The size of the polygons may not be fixed within all locations on the surface of the model. Assumptions are made regarding the connectivity of the polygons. It is assumed that each polygon will have an inside area, and neighboring polygons along its edges and each vertex will have a set of connected polygons. It is also assumed that each polygon will have at most n neighboring polygons, each sharing an entire edge with the polygon, where n is the number of edges in the polygon. The mesh model further relies on knowing all the polygons connected to each vertex. The methodology advances to block 305.

In block 305, the user interactively creates a mesh feature. In particular, the feature refers to a self-contained geometric entity imposed on a base geometry, which in this example is the model of a vehicle 50. The mesh feature 102 is defined by a sequence of mathematical operations used to displace a set of mesh nodes in order to achieve a particular deformation effect on the model. The mesh features 102 share common characteristics, that is, each is definable using a modifiable set of parameters. Each mesh feature 102 is stored in a feature library 14b as an independent entity that is applied to the model, and the defining parameters of the feature are described in a local coordinate frame that is independent of the model to which the feature may be applied. The mesh feature 102 may include a homogeneous transformation matrix 106 as part of its definition.

Various feature-driven, and parametric-driven techniques are known in the art for creating a mesh feature 102, such as Direct Surface Manipulation and Free-Form Deformation, or the like. It should be appreciated that the user 26 may select the technique for creating the mesh feature 102 depending on the type of feature to be modified. In fact, the user 26 may try more than one methodology and select the one that modifies the feature 102 pursuant to the user's intent. For example, the methodology may provide the user 26 with the option of choosing a deformation technique, such as DSM or Free-Form Deformation, that best represents the intended model.

In DSM, an entire surface feature is placed on an existing parametric surface as a single geometric entity. After the feature is created, the user can intuitively control its location, shape and continuity independently by adjusting corresponding parameters on a real-time basis. Advantageously, DSM provides for modifications to a mesh model without relying on CAD techniques.

Using DSM, a local region of the surface can be deformed quickly and accurately to change a predetermined DSM feature parameter. An example of a modifiable DSM parameter is adjusting the magnitude or height of the deformation, moving, scaling or reorienting or adjusting the boundary of the deformed region, editing the character of the deformation by changing the underlying DSM basis function, or deleting a DSM feature.

An example of a technique for Direct Surface Manipulation of a model is disclosed in commonly assigned U.S. patent Ser. No. 09/681,732, the disclosure of which is incorporated herein by reference. With this technique, the user first sketches a closed curve on a plane that describes a boundary of the region to be deformed. A point, curve or area inside the boundary is designated as the "point" of maximum deformation. The mesh model is then projected onto the DSM plane, such as by using parallel projection techniques. All of the nodes of the model projected interior to the boundary are then displaced by the maximum deformation amount multiplied by a polynomial basis function, which is 0 at the boundary and 1 at the maximum deformation point, i.e. $V^{new}=V+Df(t)$, where V is a node, f is the basis function value at V, t is the result of parameterization of V in the space of the feature, and D is the maximum displacement vector. After the feature is created, a user may then control the DSM feature's location, size, shape and continuity by adjusting corresponding parameters.

Another technique of Direct Surface Manipulation is known as Free-Form Deformation (FFD) disclosed in commonly assigned U.S. patent Ser. No. 09/890,411. FFD provides for modification of an object embedded in a volume described by a three-dimensional grid or lattice. The object is deformed as the lattice deforms. In applying this technology to a mesh, the region of the mesh to be modified is embedded inside a volume, and the location of each mesh node with respect to the volume is determined. The volume is then deformed and distorted, causing the embedded mesh to also deform. The lattice may be deformed interactively by repositioning its vertices. FFD involves the mapping from the domain of the lattice into the model space using $$V = \sum_i^{i_{max}} \sum_j^{j_{max}} \sum_k^{k_{max}} B_i(u)B_j(v)B_k(w)P_{i,j,k}$$

where (uvw) is a point in the domain and V is its projection into the object space, $\{P_{i,j,k}\}$ are the lattice vertices, and $\{B_i\}$, $\{B_j\}$, $\{B_k\}$ are the basis functions in the u,v,w directions respectively. To reposition a node point V inside the lattice volume, V is parameterized using the above equation. The resulting (u,v,w) may be used to evaluate the basis functions of lattice vertices. After the lattice vertices are repositioned, the resulting displacement of V can be found using $$\Delta V = \sum_i^{i_{max}} \sum_j^{j_{max}} \sum_k^{k_{max}} B_i(u)B_j(v)B_k(w)\Delta P_{i,j,k}$$

where $\{\Delta P_{i,j,k}\}$ are the new positions of the lattice vertices.

The methodology advances to block 310. In block 310, the user saves the newly created mesh feature 102 on a data storage system, or feature library 14b associated with the remotely located computer system. Individually stored features can then be imported into a computer 24b and applied to a mesh in a proper order. Referring to FIG. 3, an example illustrating how the features are stored a computer memory at run time is provided at 100. In this example, the mesh features 102 are context-free, and stored as a list. The feature list 102 includes defining parameters 104 that are described in a local coordinate plane that is independent of the model to which the feature may be applied. A homogeneous transformation matrix 106 is stored as an integral part of the mesh feature definition. Characteristics shared by the mesh features 102 include modifiability, repeatability and reusability. It should be appreciated that a mesh feature 102 may be history supported, that is, the operational history of the feature is saved. In this way, the effect of the feature 102 is available to be replayed at a later time.

An advantage of storing features in a feature library 14b is that different design programs for similar products can share a common feature library 14b. This may result in a significant timesaving in preparing the mesh data, since the features 102 are stored separately as distinct entities and applied to the base model, and the base model is not modified.

The feature library 14b may be accessed from a menu displayed on the screen. For example, a menu may contain a "Feature Catalog" option that is accessed by using the mouse 24c to "click" on the "Feature Catalog" button. The feature catalog option may provide a display including a list of features already associated with the model currently being worked on. Various other menu options may include "delete" to delete a feature, "rename" to change the name and directory of a cataloged feature file, "done" to quit the menu, or "cancel" to delete the previous operations, or the like. The methodology advances to block 315.

In block 315, the user 26 establishes a feature matrix describing how the various combinations of features are to be applied to the base model and the order in which they are applied. An example of a feature matrix for the DOE analysis of this example is illustrated in FIG. 4. In this example, the feature matrix, shown at 80, is a standard form orthogonal array table containing information relating to specific features. The user 26 specifies the features 102 to be applied to the base model 50, and the features 102 are listed in the order in which they are to be applied to the base model 50. Advantageously, the user 26 can group features according to different analysis criteria, specify output file names, or change and verify replay order in the case of multiple overlapping mesh features. In this example, each combination of features 102 corresponds to a test run for the DOE, as shown at 82, and the features 102 are listed across the top row as shown at 84. The matrix indicates whether a feature is applied to the base model for a particular run, as shown at 86.

The methodology allows the user 26 to interactively change the predetermined order in which features are applied to the base model, since features may overlap each other during replay, that is, a node may be displaced by more than one mesh feature. The parameterization of a node according to a feature depends on the physical location of the node at the time of parameterization, and the effects of features are generally not commutative. That is, the combined effect of the two features may be different depending on the order of their application. Since the features are obtained from a feature library 14b, and may be created at different times, the order may need to be established by the user 26. The user 26 may also visually inspect the model with the added features to identify an unintended result. For example, as shown in FIG. 5a at 120, if a spoiler feature 122 is applied to the base model after the back end 124 of the model is stretched, the spoiler 122 may be misplaced. In FIG. 5b, the spoiler 122 is first applied to the base model 50, and then the back end of the model 50 is stretched as shown at 126. Generally, the smaller features are applied first to the base model, and then the larger features are applied.

The methodology advances to block 320, and the user 26 prompts the computer program to automatically apply the mesh features to the base model according to the instructions in the feature matrix 80. In this example, a replay mode is utilized to apply the features to the model 50. With a large-scale mesh model, it is preferred that each individual mesh feature 102 is first created, and then the features 102 are read into the system in a predetermined order. The system then applies the features 102 to the base model 50 in the predetermined order, to create a new model. The new model may be stored in a model library 14a, as previously described.

Two types of replay modes are anticipated, order-dependent and order-independent. An order-dependent replay mode allows the user 26 to specify the order in which the mesh features 102 are applied to the base mesh model 50. The order-dependent replay mode is primarily utilized where mesh features 102 overlap each other, assuming the shape of a feature depends the existence of other features created prior to it. In this case, some nodes are going to be displaced by more than one mesh feature 102. Since the effect of a mesh feature 102 on a point depends in part on parameterization of the point, which is dependent on the geometric location of the point with respect to the feature framework at the time the parametrization is executed, the affect of two features on the point is different if the order of applying the two features is switched. An example of an order-dependent mode is described with respect to FIG. 6.

An order-independent replay mode is insensitive to the order in which the features are replayed, because the parametrization of a node point is only based on its location in the base model, disregarding the effect of any preceding features may have on it. An example of an order-independent replay mode is described with respect to FIG. 7. This methodology enhances the order-dependent and order-independent replay modes by allowing the replay mode to execute many times, each time using a unique set of mesh features as specified by the user 26. The mesh feature replay also allows a user to quickly modify a base model into a new configuration. The methodology advances to block 325.

In block 325, the methodology makes the features 102 in the feature library 14b, feature matrix 80 and family of new models 158 available to the user 26 for further use, such as the DOE analysis of this example. Advantageously, a plurality of individually-created mesh features 102 is applied to a base model 50 to produce a family of mesh models 158. The family of mesh models 158 may correspond to experimental runs, as defined by the combinations of features in the array. The combination of mesh features with the automatic generation of a DOE model provides increased flexibility and productivity in pre-processing FEA meshes for CAE based DOE, which is a powerful alternative to the use of a physical prototype-based DOE study. The airflow DOE using Computational Fluid Dynamics of this example uses DOE parameters such as vehicle drag, lift coefficients and wind noise.

It should be appreciated that the above-described methodology is executable in an iterative manner, since the user 26 may elect to consider various sets of design parameters as part of a comprehensive study, or compare the results of the methodologies for modifying the feature. The methodology provides the family of models 158 in a user defined format. The above-described methodology also provides for direct and interactive editing of a mesh model by applying a local or global deformation to the base mesh model 50. The user 26 may catalog the mesh feature 102 in a feature library 14b for rapid repeated creation of a specific effect of deformation on different mesh models. The user 26 also builds a feature matrix 80 of information for automatically applying features to the base model 50 and generating a family of new mesh models 158. The new mesh models are available as an input to a CAE analysis, such as the DOE example utilized herein.

Referring to FIG. 6, an example of an order-dependent replay mode is illustrated. The methodology begins in block 400 when call for by block 320 in FIG. 2 and advances to block 405. In block 405, the methodology selects a feature 102 listed in the feature matrix 80 and imports a model node $V_{i\ orig}$ represented by a point $(x_i, y_i, z_i)$. It should be appreciated that the feature 102 is accessed from the feature library 14b, and a node within the feature 102 is selected. As previously described, each feature 102 is stored in a context-free format. It should be appreciated that the subscript i refers to a model node, and j refers to a features in a set. The methodology advances to block 410.

In block 410, the methodology transforms the model node $V_i$ into a local coordinate system used to define the feature $F_j$, to obtain a definition of the point $(x_i, y_i, z_i)$ in the local coordinate system, and denoted $(\bar{x}_i, \bar{y}_i, \bar{z}_i)$ example, a transformation matrix is applied to the point $(\bar{x}_i, \bar{y}_i, \bar{z}_i)$ using the equation $V_i[T_j]^{-1}$. The methodology advances to block 415.

In block 415, the methodology parameterizes the model node $\overline{V}_i$ using the feature. The parameterization technique used by $F_j$, depends on the type of feature, and the point may be denoted by (u,v,w), or (t).

Parameterization establishes a parametric association between the feature and the affected node. For a DSM feature, the parameterization would yield a parameter t, whereas for a FFD feature, (u,v,w) is found. The methodology advances to block 420.

In block 420, the methodology determines the displacement of the model node $\overline{V}_j$ due to the parameterized feature $F_j$ to obtain $\Delta \overline{V}_{ij}$. For example, the equation ($V^{new}=\overline{V}_j+D_{f(t)}$) may be used for a DSM feature. Similarly, the following equation applies to a lattice feature:

$$\overline{V}_i = \sum_{ii}^{ii_{max}} \sum_{jj}^{jj_{max}} \sum_{kk}^{kk_{max}} B_{ii}(u)B_{jj}(v)B_{kk}(w)P_{ii,jj,kk}$$

Which may include the scalar equations:

$$x_i = \sum_{ii}^{ii_{max}} \sum_{jj}^{jj_{max}} \sum_{kk}^{kk_{max}} B_{ii}(u)B_{jj}(v)B_{kk}(w)x_{P_{ii,jj,kk}}$$

$$y_i = \sum_{ii}^{ii_{max}} \sum_{jj}^{jj_{max}} \sum_{kk}^{kk_{max}} B_{ii}(u)B_{jj}(v)B_{kk}(w)y_{P_{ii,jj,kk}}$$

$$z_i = \sum_{ii}^{ii_{max}} \sum_{jj}^{jj_{max}} \sum_{kk}^{kk_{max}} B_{ii}(u)B_{jj}(v)B_{kk}(w)z_{P_{ii,jj,kk}}$$

This is a non-linear system of equations. The standard Newton's iteration can be used to solve (u,v,w) for $\overline{V}_i$.

The methodology advances to block 425, and the displacement $\Delta \overline{V}_{ij}$ is transformed into a model frame of reference for the base model, referred to as $\Delta V_{ij}$. For example, the inverse of the transformation equation $[\Delta \overline{V}_i][T_j^{-1}]$ used to transform the points into the coordinate system of the feature $F_j$ may be utilized. The methodology advances to block 430.

In block 430, the methodology updates the model node $V_i$ using the computed displacement $\Delta V_{ij}$ and the equation:

$$V_i = V_i + \Delta V_{ij}$$

The methodology advances to diamond 435 and determines if there are more features to apply to the model node. If there are more features to apply to the model node, the methodology returns to block 410 and continues. If there are no more features to apply, the methodology advances to diamond 440.

In diamond 440, the methodology determines if there are more model nodes to update. If there are more model nodes to update, the methodology returns to block 405 and continues. If there are no more model nodes to update, the methodology advances to block 445 and returns to block 320 of FIG. 2 and continues. Thus, the inner loop applies each mesh feature to a model node and the outer loop updates each node in the model.

Referring to FIG. 7, an order independent replay mode is illustrated. The parameterization of a point is performed using its original position of a node in the base model, which is not affected by any mesh features. Therefore, even if the point is affected by more than one feature, its final position is independent of the order in which the two features are replayed. The outer loop goes through each node in the model, and the inner loop goes through all the mesh features. It should be noted that the difference between an order-dependent replay and order-independent replay is that in an order-independent replay the system always uses the original location of a point for the purpose of parameterization.

The methodology begins in block 500 when call for by block 320 in FIG. 2 and advances to block 505. In block 505, the methodology selects a feature 102 from the model matrix and imports a feature node $V_{i\ orig}$. represented by a point ($x_i$, $y_i$, $z_i$). It should be appreciated that the feature 102 is accessed from the feature library 14b, and a node within the feature 102 is selected. As previously described, each feature is stored in a context-free format. It should be appreciated that the subscript i refers to a model node, and j refers to a set of features. The methodology advances to block 510.

In block 510, the methodology transforms the model node $V_{i\ orig}$ into a local coordinate system used to define the feature $F_j$, to obtain a definition of the point ($x_i$, $y_i$, $z_i$) in the local coordinate system, and denoted ($\overline{x}_i$, $\overline{y}_i$, $\overline{z}_i$) example, a transformation matrix is applied to the point ($\overline{x}_i$, $\overline{y}_i$, $\overline{z}_i$) using the equation $V_{i\ orig}.[T_j]^{-1}$. The methodology advances to block 515.

In block 515, the methodology parameterizes $\overline{V}_{i\ orig}$ using the feature. The parameterization technique used by $F_j$, depends on the type of feature, and the point may be denoted by (u,v,w), or (t).

Parameterization establishes a parametric association between the feature and the affected node. For a DSM feature, the parameterization would yield a parameter t, whereas for a FFD feature, (u,v,w) is found. The methodology advances to block 520.

In block 520, the methodology determines the displacement of the model node $\overline{V}_j$ due to the parameterized feature $F_j$ to obtain $\Delta \overline{V}_i$, as previously described for the order-dependent replay mode. The methodology advances to block 525.

In block 525, the displacement $\Delta \overline{V}_{ij}$ is transformed into a model frame of reference for the base model, referred to as $\Delta V_{ij}$. For example, the inverse of the transformation equation $[\Delta \overline{V}_i][T_j^{-1}]$ is used to transform the points into the coordinate system of the feature $F_j$ may be utilized. The methodology advances to diamond 530.

In diamond 530, the methodology determines if there are more features to apply to the model node. If there are more features to apply to the model node, the methodology returns to block 510 and continues. If there are no more features to apply, the methodology advances to block 535.

In block 535, the methodology updates the model node $V_j$ using the computed displacement $\Delta V_{ij}$ and the equation:

$$V_i = V_i + \Delta V_{ij}$$

The methodology advances to diamond 540, and determines if there are more model nodes to update. If there are more model nodes to update, the methodology returns to block 505 and continues. If there are no more model nodes to update, the methodology advances to block 545 and returns to block 320 of FIG. 2 and continues.

Figure 8:
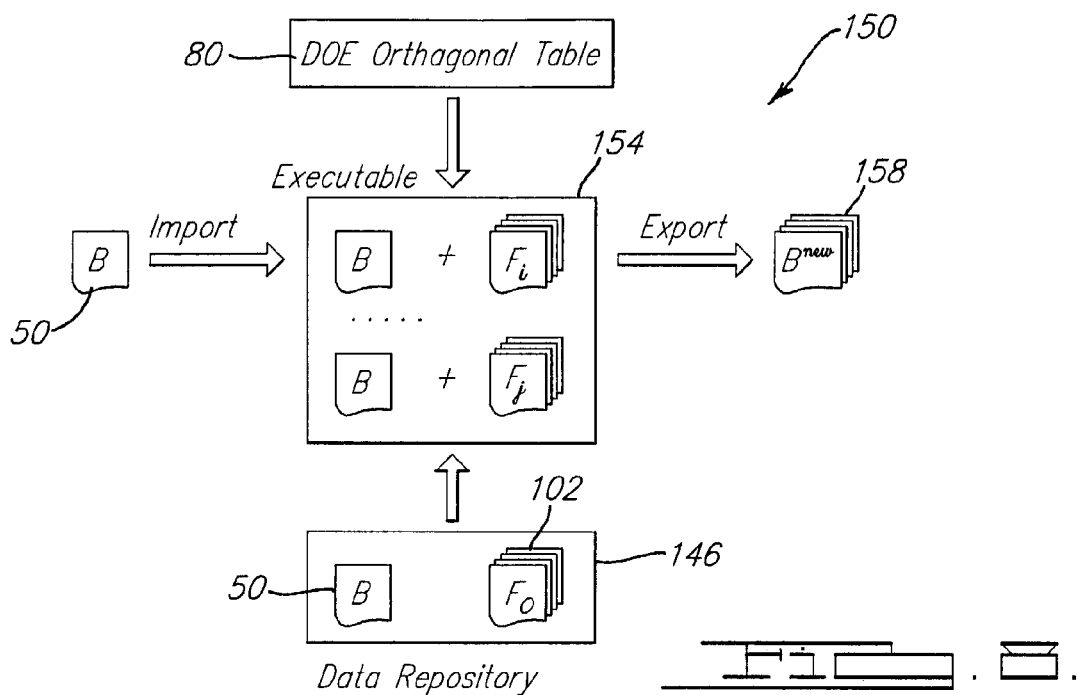
FIG. 8 is a block diagram further illustrating the implementation of the method of FIG. 2, according to the present invention.

An example of implementation of the above-described methodology to interactively create a family of mesh models is illustrated in FIGS. 8-13. In FIG. 8, a block diagram of the process flow of a computer program for creating the family of mesh models is illustrated at 150. The computer program, shown at 154 receives as an input the base model 50, the feature matrix 80, and base model 50 and features 102. The computer processes the information in the manner previously described to produce a new mesh model, shown at 158, containing the base model and the applied mesh features. The new mesh model may be part of a family of mesh models that is available as an input to another computer program for further analysis.

Figure 9:
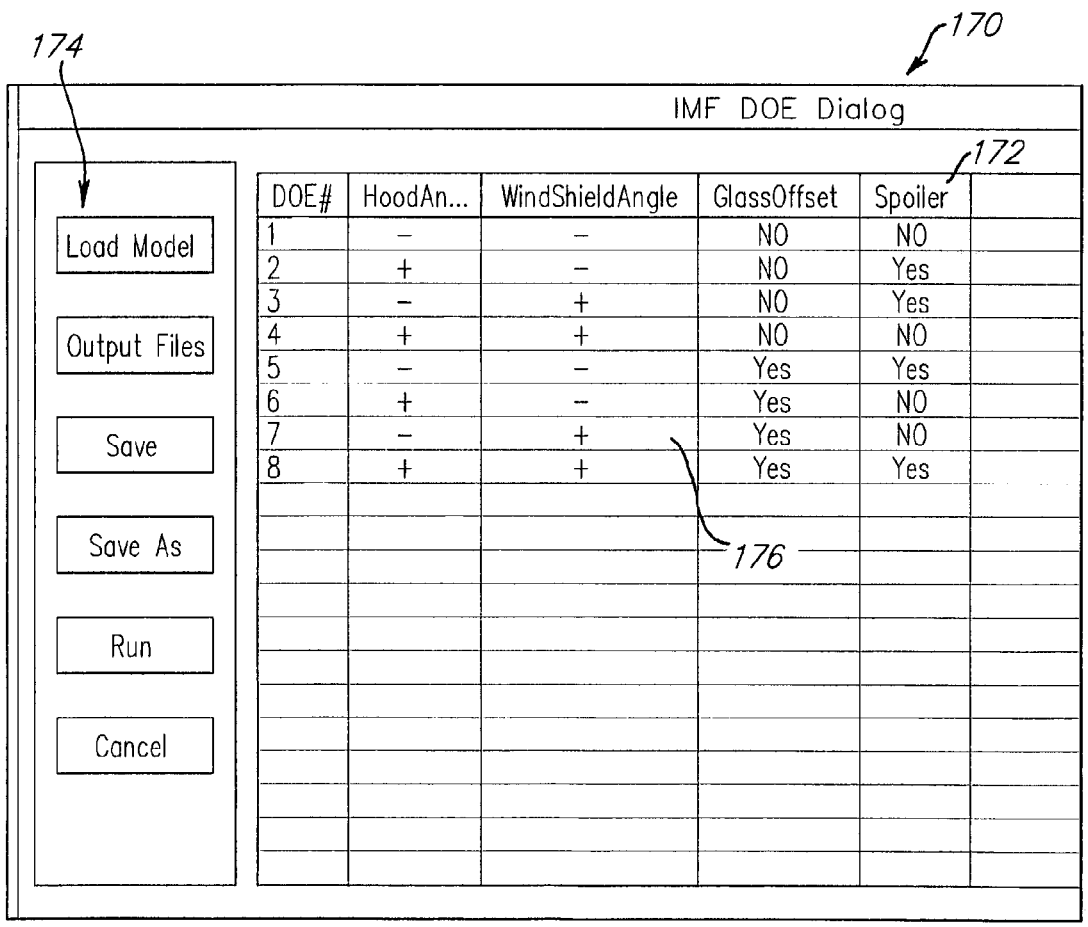
FIG. 9 is an example of a computer screen illustrating the implementation of the method of FIG. 2, according to the present invention.

As illustrated in FIG. 9 at 170, the user is provided a user interface dialog box on the display screen page containing various options for implementing the method. The user interface dialog box page may include a menu containing several options, as shown at 174. For example, the user can select the load model option to import a base model into the computer program.

The user may also access a feature option. This option reads the feature matrix and displays the matrix listing the features specified in the input file. For example, a list of deformations to be applied to the model is shown at 172. Each deformation, also known as a factor in the DOE nomenclature, can have several variations, including no deformation. In the example illustrated in FIG. 9, each factor has two variations: "+" and "−" or "Yes" and "No". Here a "+" or "Yes" text label indicates an actual deformation and will be assigned a mesh feature file during replay. A "−" or "No" text label indicates no deformation and will not be assigned a mesh feature file during replay. The order of these factors appearing in the user interface dialog box indicates the order of replay for each run, which is also modifiable interactively by the user 26. The user 26 may have the option of interactively assigning different features to different CAE analysis factors, specify output file names, and change and verify replay order in the case of multiple overlapping mesh features. The user 26 may also be provided a menu of options, such as for adding features, deleting features, or changing the order in which the features are applied. In addition, each time a new feature is imported onto the list, the user can be given an opportunity to interactively reposition, reorient and resize the feature. This may be necessary if a generic feature is applied to the base model. The user may select to view the result of any changes made before execution of the file. Other user options may include the ability to save the changes, or the like. In addition, the user may select a run option to create the mesh models specified in the matrix.

For example, to change the order in which the features are applied, the user 26 may use the mouse 24c to point and select a feature line item and drag that line item to another position in the list. In this example, the system 10 automatically replays all of the features so that the user 26 can check the result.

Advantageously, various model programs can share a common mesh feature library. In addition, previously completed mesh deformations can be reused. This may result in significant timesavings in preparing the mesh data for a subsequent analysis, such as DOE.

In the example, airflow analysis of a vehicle, the effects of four factors may be studied, hood angle, windshield angle, and presence of a spoiler and length of the back end. As indicated in the feature matrix at 176, each factor has two levels, and the base model is represented by the lower value for each factor. The cowl-line curvature is represented by a DSM feature, the windshield angle is modeled using a FFD feature, the spoiler is represented by another DSM feature, and the stretching of the back end is represented by another FFD feature. The various feature combinations are applied to the base model as designated by the feature matrix. Thus, run 1 is the base model, run 4 includes the modified cowl-line feature, and the stretched backend feature, while run 8 includes all four features.

Figure 10A:
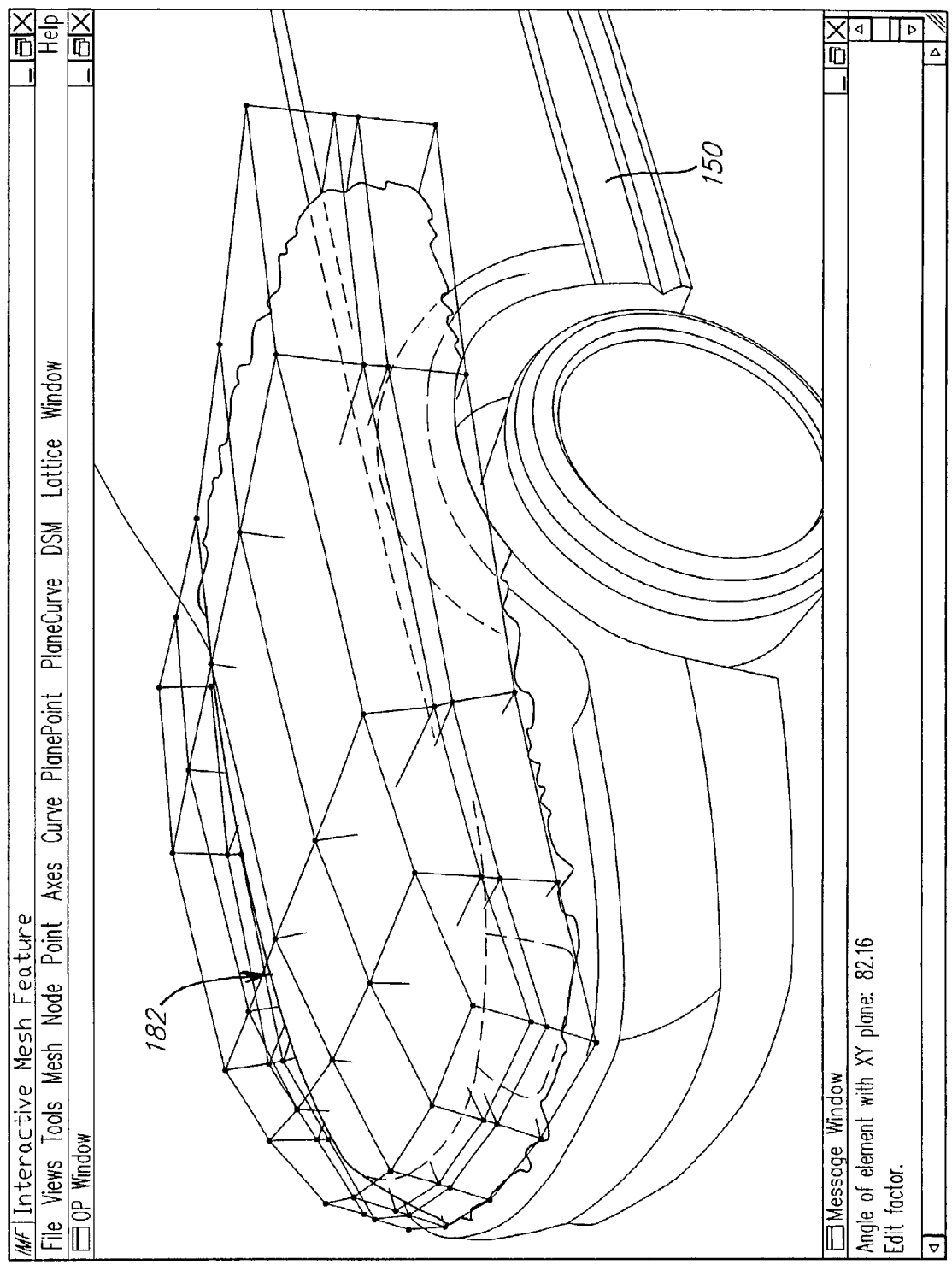
FIGS. 10a-10b are diagrammatic views illustrating the effect deforming a hood angle feature on a base model, using the method of FIG. 2.
Figure 10B:
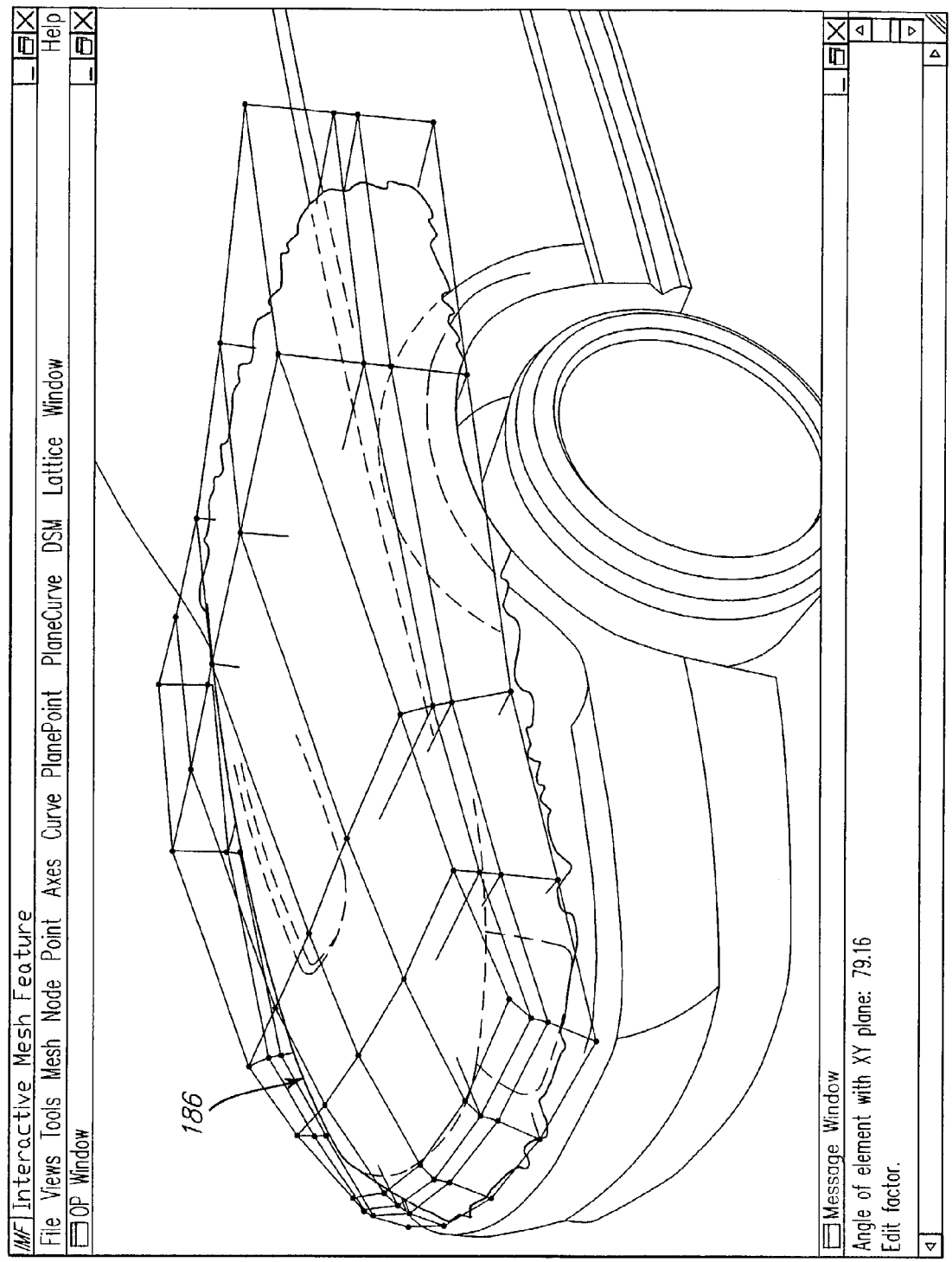
Figure 11A:
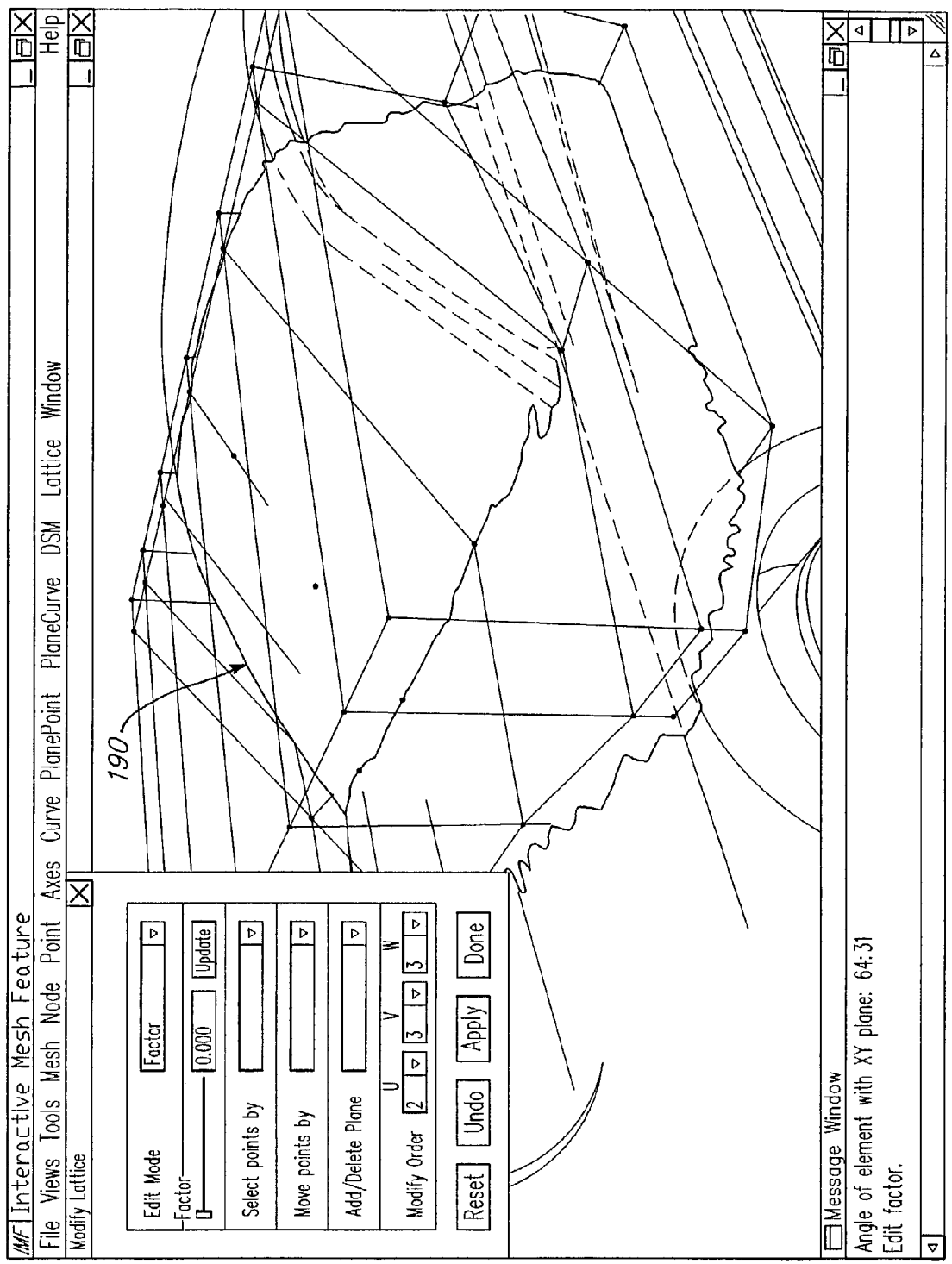
FIGS. 11a-11b are diagrammatic views illustrating the effect deforming a windshield angle feature on a base model, using the method of FIG. 2.
Figure 11B:
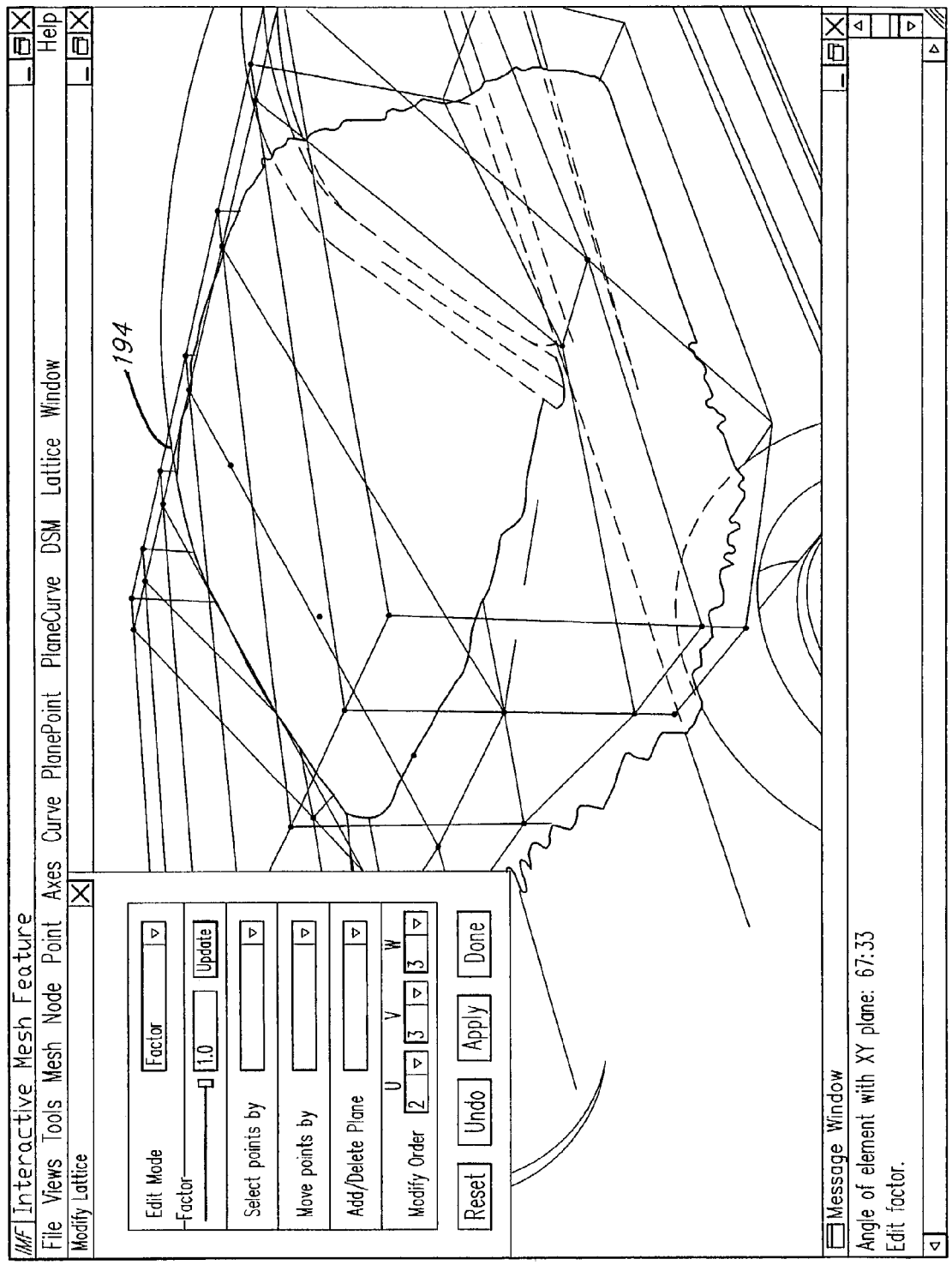
Figure 12A:
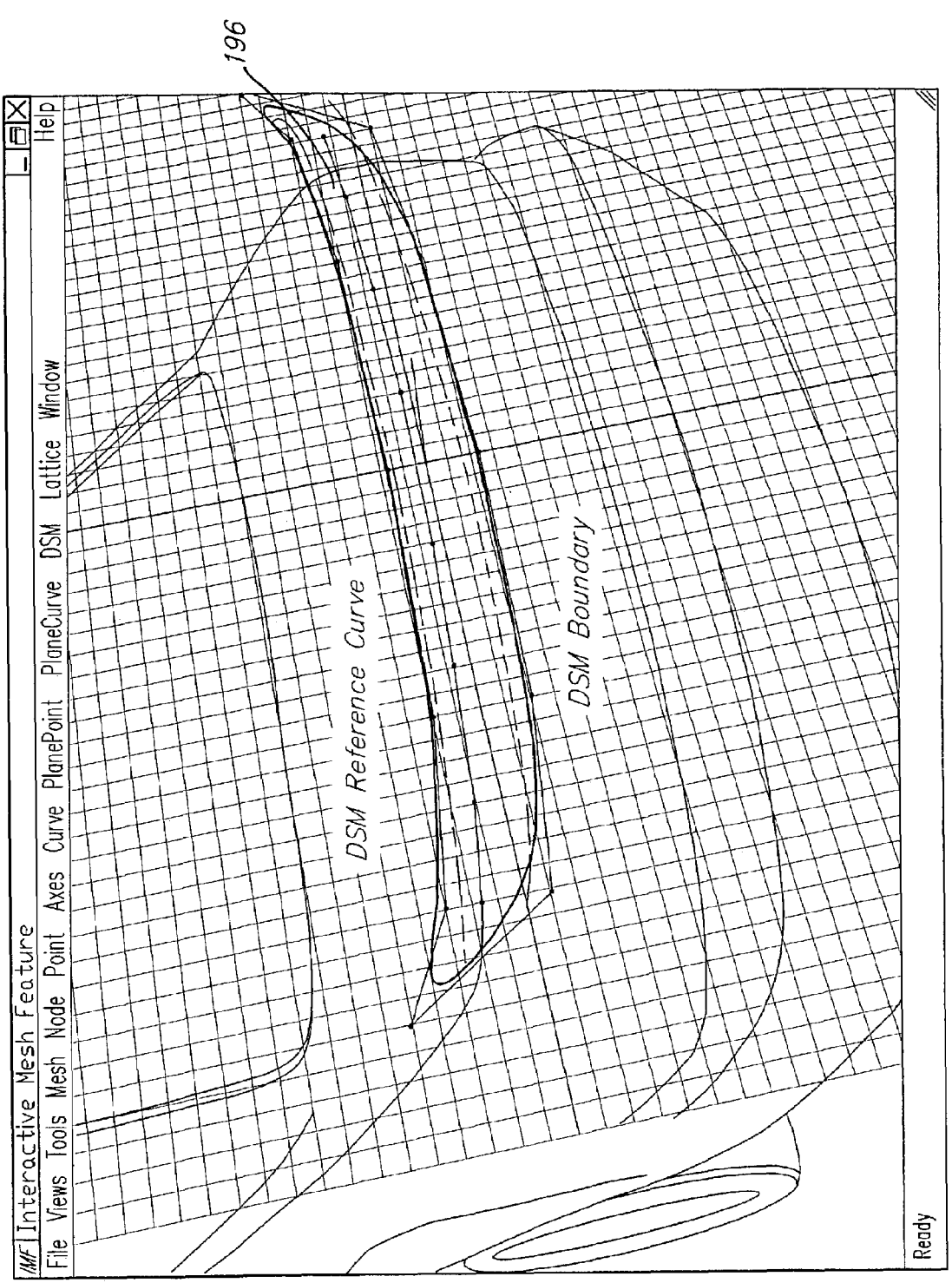
FIGS. 12a-12c are diagrammatic views illustrating the effect adding a spoiler to a base model, using the method of FIG. 2.
Figure 12B:
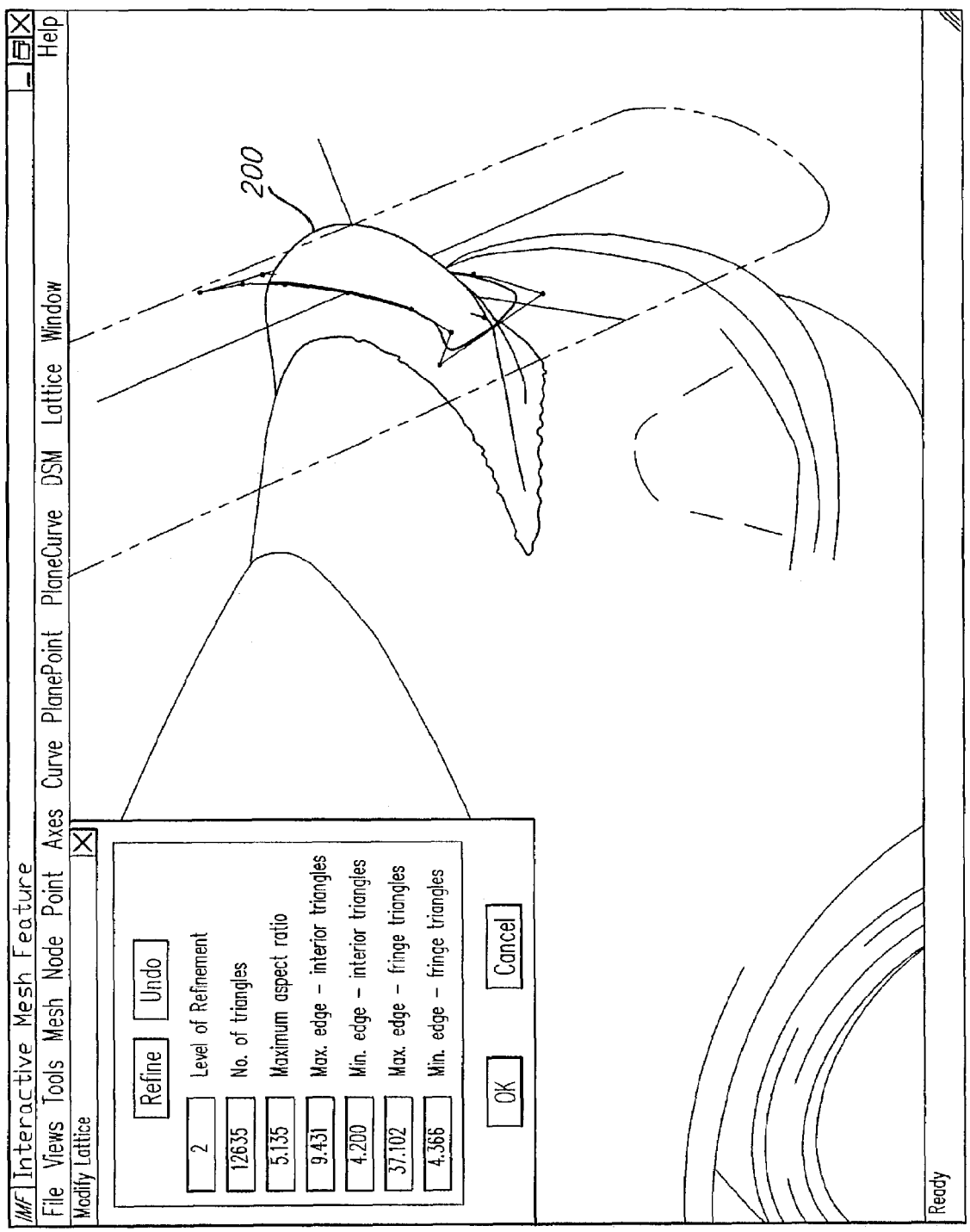
Figure 12C:
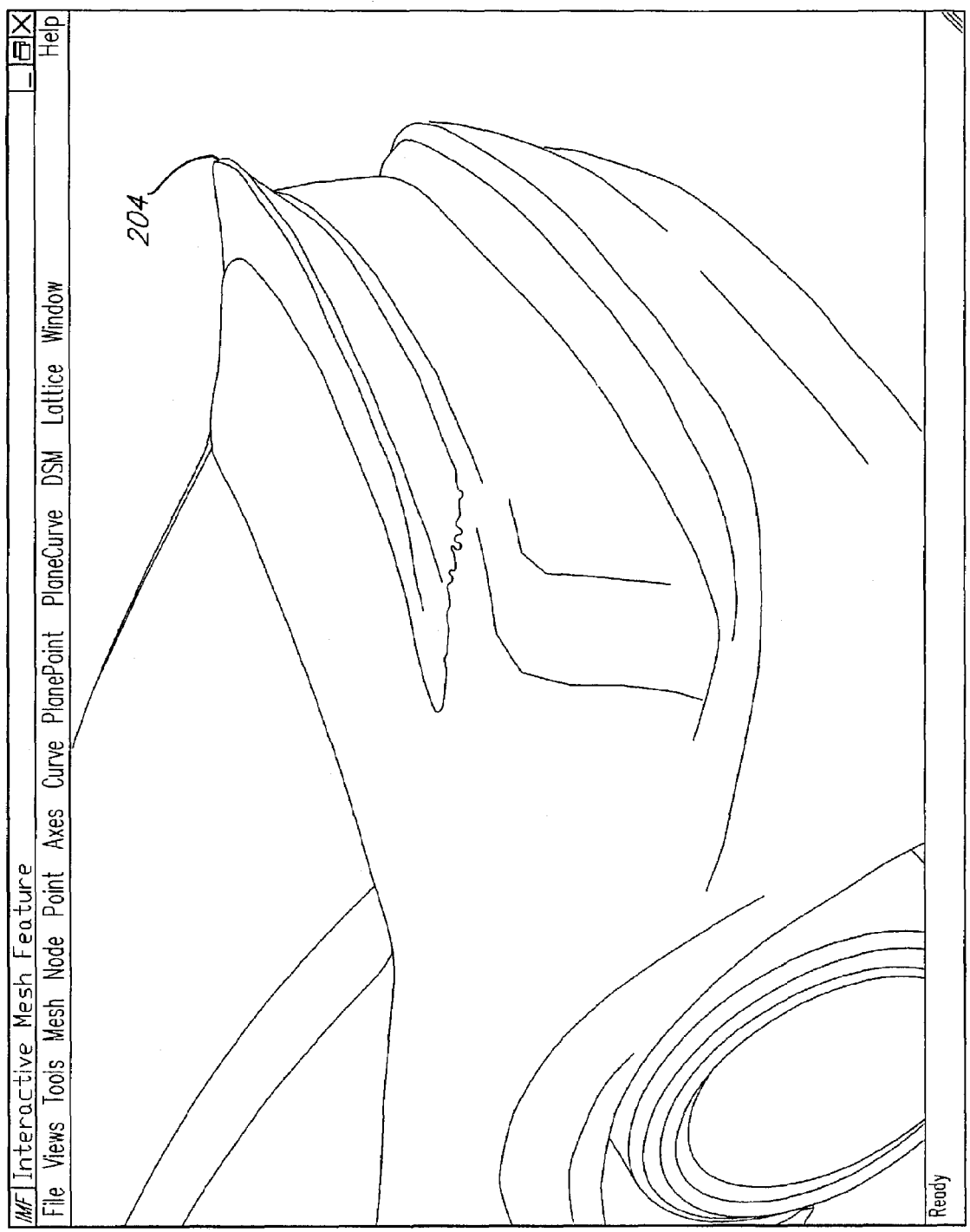

Referring to FIG. 10a, a screen 180 illustrating the base model before lattice deformation of the hood angle feature 182 is illustrated. A screen 184 of the new model with the modified hood angle 186 is illustrated in FIG. 10b. Referring to FIG. 11a, a screen 188 illustrating the base model before deformation of the windshield angle is illustrated at 190. Similarly, a screen 192 illustrating the new model with the deformed windshield angle is illustrated at 194. Referring to FIGS. 12a, 12b and 12c, the effect of modifying a spoiler is illustrated. A screen 195 illustrating the base model before lattice deformation of the spoiler feature is illustrated at 196. A screen 198 of a modified spoiler feature is illustrated at 200. A screen 202 of the new model with the new spoiler 204 is illustrated at 204. In FIG. 13, a screen 206 is provided illustrating a new model with all the described new features, as shown at 208.

Advantageously, the family of mesh models in FIGS. 10-13 is available for use by other analysis programs. The use of a context-free mesh feature formal allows the user to manage specific effects of mesh manipulation and encapsulated mathematical operations, that can be stored independently of the model to which they apply. Alternatively, they can be applied repeatedly to the same or a different model with minimum customization. Libraries of mesh features can be established to archive useful features for future use.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A system for interactively generating a geometric mesh model by a user comprising:
   a user computer system, wherein said user computer system includes a memory, a processor, a user input device and a display device;
   a remotely located computer system in communication with said user computer system, wherein said remotely located computer system includes a processor, a memory, and a data storage means;
   a computer-generated geometric base mesh model stored in said data storage means;
   a computer-generated mesh feature stored in said data storage means, wherein the user uses the user computer system to communicate with said remotely located computer system to interactively create said mesh feature and store said mesh feature in said data storage means;
   a feature matrix containing predetermined instructions for applying a selected mesh feature to the base mesh model, that is accessible to the user computer system and the remotely located computer system; and
   a new mesh model generated according to said feature matrix, wherein said new mesh model includes the base mesh model and said selected mesh feature, and said new mesh model is available for further study, as the geometric mesh model.

2. A system as set forth in claim 1 wherein said data storage means includes a model library and said base mesh model is stored in said model library.

3. A system as set forth in claim 1 wherein said data storage means includes a mesh feature library, and said mesh feature is stored in said mesh feature library in a context-free format independent of the base mesh model.

4. A system as set forth in claim 1 wherein said mesh feature is created using Direct Surface Manipulation to model a surface of said base mesh model as an elastic sheet to determine a deformation of the surface.

5. A system as set forth in claim 1 wherein said mesh feature is created using Free-Form Deformation to embed said base mesh model in a lattice structure and determine a deformation of the lattice.

6. A system as set forth in claim 1 wherein a plurality of mesh features are selected from said mesh features stored in said data storage means and applied to said base mesh model, to generate a family of new mesh models.

7. A system as set forth in claim 6 wherein said feature matrix contains instructions for selectively applying said mesh features to said base mesh model in a predetermined order determined by the user.

8. A method for interactively generating a geometric mesh model using a computer system, said method comprising the steps of:
  selecting a base mesh model, wherein the base mesh model is a mesh model stored in a data storage means in communication with the computer system;
  creating a mesh feature, wherein the mesh feature is defined by a modifiable set of parameters;
  saving the mesh feature in a mesh feature library maintained in the data storage means;
  establishing a feature matrix by a user, wherein the feature matrix contains instructions for applying a mesh feature selected from the mesh feature library to the base mesh model;
  applying the selected mesh feature to the base mesh model using the feature matrix, to generate a new mesh model; and
  making the new mesh model available for further study, as the geometric mesh model.

9. A method as set forth in claim 8 where said step of selecting a base mesh model includes the step of selecting the base mesh model from a model library maintained in a data storage means.

10. A method as set forth in claim 8 wherein said step of creating a mesh feature includes the step of creating the mesh feature using Direct Surface Manipulation of a surface of the base mesh model.

11. A method as set forth in claim 8 wherein said step of creating a mesh feature includes the step of creating the mesh feature using Free-Form Deformation of a surface of the base mesh model.

12. A method as set forth in claim 8 where said step of saving the mesh feature includes the step of saving the mesh feature in a context-free format.

13. A method as set forth in claim 12 wherein an operational history of the mesh feature is saved.

14. A method as set forth in claim 8 wherein said step of applying the mesh feature to the base mesh model further includes the step of applying a plurality of mesh features to the base mesh model in a predetermined order interactively determined by the user.

15. A method as set forth in claim 8 wherein said step of applying the mesh feature to the base mesh model further includes the step of applying a plurality of mesh features to the base mesh model in an independent order.

16. The method as set forth in claim 8 wherein said step of establishing a feature matrix includes the steps of:
  selecting mesh features to be applied to the base mesh model;
  ordering the mesh features to be applied to the base mesh model; and
  selectively combining the mesh features to be applied to the base mesh model.

17. The method as set forth in claim 8 wherein said step of
  generating the new mesh model includes the step of saving the new mesh model on a remotely located database.

18. The method as set forth in claim 8, wherein said step of applying the mesh feature to the base mesh model further includes the step of replaying the order of applying the mesh feature to the base mesh model by:
  selecting a base mesh model node;
  transforming the base mesh model node into a local coordinate system used to define the mesh feature;
  parameterizing the base mesh model node to establish a parametric association between the mesh feature and the base mesh model node;
  determining a displacement of the parametrized base mesh model node due to the mesh feature;
  transforming the displacement into a base mesh model frame of reference;
  updating the base mesh model node using the determined displacement; and
  determining if there are more mesh features to apply to the base mesh model node and continuing to update the base mesh model node if all the mesh features have not been applied, determining if all the base mesh model nodes have been updated if there are no more mesh features to apply, and continuing to update the base mesh model nodes if there are more base mesh model nodes to update.

19. A method for interactively generating a geometric mesh model, said method comprising the steps of:
  selecting a base mesh model, wherein the base mesh model is a mesh model stored in a model library maintained in a data storage means in communication with a remotely located computer system;
  creating a mesh feature that is defined by a modifiable set of parameters using a user computer system that is in communication with the remotely located computer system;
  saving the mesh feature in a context-free format in a mesh feature library maintained in the data storage means;
  establishing a feature matrix by the user, wherein the feature matrix contains instructions for applying the mesh feature selected from the mesh feature library to the base mesh model;
  applying the selected mesh feature to the base mesh model to generate a new mesh model according to the feature matrix;
  replaying an order of applying the feature to the base mesh model;
  saving the new mesh model on the data storage means; and
  making the new mesh model available for further study, as the geometric mesh model.

20. A method as set forth in claim 19 wherein said step of creating a mesh feature includes the step of creating the mesh feature using Direct Surface Manipulation of a surface of the base mesh model.

21. A method as set forth in claim 19 wherein said step of creating a mesh feature includes the step of creating the mesh feature using Free-Form Deformation of a surface of the base mesh model.

22. A method as set forth in claim 19 wherein said step of applying the mesh feature to the base mesh model further includes the step of applying a plurality of mesh features to the base mesh model in a predetermined order interactively determined by the user.

23. A method as set forth in claim 19 wherein said step of applying the mesh feature to the base mesh model further includes the step of applying a plurality of mesh features to the base mesh model in an independent order.

24. The method as set forth in claim 19 wherein said step of establishing a feature matrix includes the steps of:

selecting a plurality of mesh features to be applied to the base mesh model;

ordering the mesh features to be applied to the base mesh model; and selectively combining the mesh features to be applied to the base mesh model.

25. The method as set forth in claim 19, wherein said step of applying the mesh feature to the base mesh model further includes the step of:

selecting a base mesh model node;

transforming the base mesh model node into a local coordinate system used to define the mesh feature;

parameterizing the base mesh model node to establish a parametric association between the mesh feature and the base mesh model node;

determining a displacement of the parametrized base mesh model node due to the mesh feature;

transforming the displacement into a base mesh model frame of reference;

updating the base mesh model node using the determined displacement; and determining if there are more mesh features to apply to the base mesh model node and continuing to update the base mesh model node if all the mesh features have not been applied, determining if all the base mesh model nodes have been updated if there are no more mesh features to apply, and continuing to update the base mesh model nodes if there are more base mesh model nodes to update.

* * * * *